(12) United States Patent
Hariharan et al.

(10) Patent No.: US 7,175,685 B1
(45) Date of Patent: Feb. 13, 2007

(54) DRY CONVERSION OF HIGH PURITY ULTRAFINE SILICON POWDER TO DENSIFIED PELLET FORM FOR SILICON MELTING APPLICATIONS

(75) Inventors: Alleppey V Hariharan, Austin, TX (US); Mohan Chandra, Merrimack, NH (US); Kedar P Gupta, Hollis, NH (US)

(73) Assignee: GT Solar Incorporated, Merrimack, NH (US)

( * ) Notice: Subject to any disclaimer, the term of this patent is extended or adjusted under 35 U.S.C. 154(b) by 261 days.

(21) Appl. No.: 10/413,774

(22) Filed: Apr. 15, 2003

Related U.S. Application Data

(60) Provisional application No. 60/372,980, filed on Apr. 15, 2002.

(51) Int. Cl.
*C22C 28/00* (2006.01)
*B22F 1/00* (2006.01)

(52) U.S. Cl. .......................................... 75/228; 419/66

(58) Field of Classification Search ................ 419/66; 75/228
See application file for complete search history.

(56) References Cited

U.S. PATENT DOCUMENTS

| | | | |
|---|---|---|---|
| 4,040,848 A | 8/1977 | Greskovich et al. | |
| 4,040,849 A | 8/1977 | Greskovich et al. | |
| 4,892,694 A | 1/1990 | Ritzer et al. | |
| 5,073,358 A | 12/1991 | Shimizu et al. | |
| 5,094,832 A * | 3/1992 | Forwald et al. | 423/349 |
| 5,126,203 A * | 6/1992 | Ritzer et al. | 428/403 |
| 5,208,001 A * | 5/1993 | Truitt et al. | 423/348 |
| 5,244,639 A * | 9/1993 | Aratani et al. | 422/199 |
| 6,403,158 B1 * | 6/2002 | Corman | 427/295 |
| 6,454,994 B1 * | 9/2002 | Wang | 420/427 |
| 6,887,448 B2 * | 5/2005 | Block et al. | 423/349 |

FOREIGN PATENT DOCUMENTS

| | | |
|---|---|---|
| JP | 09002811 | 1/1997 |
| JP | 09002811 A * | 1/1997 |
| JP | 10203818 | 8/1998 |
| JP | 11199382 | 7/1999 |
| WO | WO 00/37719 | 6/2000 |

OTHER PUBLICATIONS

O'Mara, William C., Handbook of Semiconductor Silicon Technology, 1990, pp. 81-82, Noyes Publication.
Santana, C.J., The effects of processing conditions on the density and microstructure of hot-pressed silicon powder, Journal of Materials Science, 1996, pp. 4985-4990, vol. 31.
Takatori, K., High Pressure Hot-Pressing of Silicon Powders, Journal Jap. Soc. Powder Metall., 1981, pp. 15-19, vol. 28.
Moeller, H.J., Sintering of Ultrafine Silicon Powder, Journal of the American Ceramic Society, 1985, pp. 320-325, vol. 68, No. 6.
Greskovich, C., The effect of small amounts of B and Sn on the sintering of silicon, Journal of Materials Science, 2981, pp. 613-619, vol. 16.
Moeller, H.J., Sintering of Silicon, Abstract from Conference Paper, 1982, Network GmbH, Wunstorf, West Germany.

* cited by examiner

*Primary Examiner*—Roy King
*Assistant Examiner*—Kathleen McNelis
(74) *Attorney, Agent, or Firm*—Maine & Asmus

(57) ABSTRACT

A bulk silicon material for making silicon ingots, consisting of silicon pellets, and a method for making the pellets from an agglomerate-free source of high purity silicon powder by feeding a controlled amount of silicon powder that is free of intentional additives and binders into a pellet die, and dry compacting the powder at ambient temperature with pressure to produce a pellet that has a density of about 50–75% of the theoretical density of elemental silicon, a weight within a range of about 1.0 gram to about 3.0 grams and preferably of about 2.3 grams, a diameter in the range of 10 mm to 20 mm and preferably of about 14 mm, and a height in the range of 5 mm to 15 mm and preferably of about 10 mm.

33 Claims, No Drawings

DRY CONVERSION OF HIGH PURITY ULTRAFINE SILICON POWDER TO DENSIFIED PELLET FORM FOR SILICON MELTING APPLICATIONS

RELATED APPLICATIONS

This application is a non-provisional application related to and claiming benefit of U.S. Provisional Patent Application Ser. No. 60/372,980, filed Apr. 15, 2002, under 35 U.S.C. §119(e). This application is herein incorporated in its entirety by reference.

FIELD OF INVENTION

This invention relates to raw materials used for melting to make silicon ingots, in particular to a bulk silicon material consisting of silicon pellets make by compacting silicon powder without additives or binders under pressure at ambient temperatures into pellet form.

BACKGROUND OF THE INVENTION

High-pressure hot pressing of silicon powder with sintering aids and subsequent high temperature sintering of pressed silicon bodies are known in the literature.

Pellet pressing of powders is well known in metallurgical and ceramic process industries. All such processes utilize some binder or additive to effect compaction and pressing. In some instances sintering aids are purposely added in the pellet process. The binders/additives/aids leave a residue of organic or inorganic nature during subsequent use or other operations. In addition, pressed bodies are sintered at high temperatures to provide pellet strength. Pellet pressing is also utilized in pharmaceutical industries to manufacture medicinal tablets. Inert additives and binders, innocuous to patients, are utilized to convert drug chemical powders to compacted tablets.

Ultra fine silicon is a by-product of the Fluid Bed process to manufacture high purity electronic grade polysilicon. In this process silicon is deposited by thermal decomposition of silane ($SiH_4$) gas on granules of silicon seed particles. The granules grow in size from an initial seed size of about 0.2 mm (millimeter) to about 1 mm in diameter. The granules are utilized in silicon melting and crystal growth applications.

The Fluid Bed process, however, also results in a large quantity of ultra fine silicon dust. This is tapped out of the reactor and remains as a process waste. This powder is of high purity, but cannot be recycled or used in silicon melting applications.

There are also other sources of less pure silicon powder, such as reaction residues from preparation of organochlorosilanes or chlorosilanes from the reaction of elemental silicon with chlorinated hydrocarbons or hydrogen chloride. The powder is used as a feed in alternate but less demanding industries such as for steel hardening, addition to aluminum melts, manufacture of silicon nitride, and so forth. For such applications the powder is agglomerated with a binding agent to form granules of 250–500 microns. The binders are typically organic materials such as starch, and lignin. Other agglomeration methods include microwave heating of the powder (particles of less than about 100 μm) to 1200°–1500° C.

Where it is necessary to stabilize silicon dust and powder and make them into a more stable form for transportation and disposal (deactivation of silicon) the silicon dust is milled in an aqueous solution of pH>5 to form colloidal silica. This helps to agglomerate the dust.

High-pressure hot pressing of silicon powders are described in the art, such as in *The Effects of Processing Conditions on the Density and Microstructure of Hot-Pressed Si Powder*, by C. J. Santana and K. S. Jones, J. Materials Sci. 31 (18), 4985–4990 (1996); and *High Pressure Hot-Pressing of Si Powders*, by K. Takatori, M. Shimada and M. Koizumi, J. Jap. Soc. Powder Metal. 28 (1) 15–19 (1981).

In one such application silicon powder was hot pressed into polycrystalline wafers 1.5" diameter using various process conditions, typically hot pressing at 1300° C./2000 psi in hydrogen gas ambience. Densification typically proceeds with increasing temperature and applied pressure. There are also several studies of sintering silicon compacts at high temperatures, ranging from 1250° C. to close to the melting point of Si (1412° C.), in an inert atmosphere. Silicon sintering with addition of sintering aids such as Boron, or retardants such as Tin, is described in the art. There is no way demonstrated in the art to obtain a dry silicon pellet from silicon powder without added binder or added heat.

SUMMARY OF THE INVENTION

It is an object of the invention to provide a viable and practical process and machinery to convert otherwise unusable ultra fine silicon powder into a form factor, typically pressed pellets, that can be utilized in silicon melting processes. It is a further object to provide a process and machinery that will maintain the purity of the silicon to nearly the same level as the starting powder.

It is another object of the invention to provide a system and facility for conducting a powder-to-pellet conversion on a commercially useful production rate, such as high speed pellet pressing of up to 600 pellets or more per minute, and processing of up to 50 kg or more of silicon powder per hour.

The most important aspect of this invention is the development of a process that adds significant value to the silicon dust byproduct from the Fluid Bed and other processes. The universal method of treating fine powders is by addition of organic and inorganic binders to convert the powder to granules and pellets, as are practiced in ceramics industry, certain powder metallurgical industry, and pharmaceutical industry. These processes add difficult-to-remove ingredients to the compact, and which in some processes are just contaminants to the material.

However, the process of this invention presses the silicon dry without addition of any outside material and at ambient temperature. It thereby keeps the purity of the pressed pellet very close to that of the starting material. It is the combination of the ability to convert silicon dust into compressed form by a dry no-binder technique that enables subsequent value-added use of the by-product silicon powder, for example in the silicon melting processes of photovoltaic and electronic applications.

The only other application of dry pressing of powders is in the manufacture of nuclear fuel oxide pellets by the MOX process. Even in this process small quantities of zinc stearate is utilized as an additive to provide for initial agglomeration and pellet strength while also serving as a lubricant in the pressing operation. It is removed in the subsequent high temperature sintering step.

As explained above, pellet pressing of powders is well-known in metallurgical and ceramic process industries. All such processes utilize some binder or additive to effect compaction and pressing. In some instances sintering aids are purposely added in the pellet process. Notably, the binders/additives/aids leave a residue of organic or inorganic nature during subsequent operations that render those methods not useful in this instance. In addition, pressed bodies are sintered at high temperatures to provide pellet strength. However, a simple binder-less process has never been applied to press silicon. Such a method is necessary to maintain the purity of the material, which is intended for high purity conversions. High pellet strength was not a specific objective of this invention, although this can be achieved in a separate sintering process if desired.

The process of this invention utilizes binder-less cold pressing of silicon powder without additives to form pellets that can be utilized in subsequent silicon processes. There are no published prior art that purports to utilize a process for effective use of otherwise unusable silicon dust.

The main advantage is that the material purity is maintained in the powder-to-pellet conversion operation since the process of this invention is a binder-less dry method.

This invention provides a method to convert high purity, but otherwise wasted, ultra fine silicon powder into a form that is transportable in bulk, pure, and usable as feed material to silicon melting processes, and in particular those processes requiring high purity silicon.

It is an object of the present invention to provide a process for the production of pellets having the structural integrity to withstand packaging, handling and further processing being formed by compressing silicon powder at an effective force, according to one embodiment, about approximately 10,000 N (1.12 US Tons) to achieve adequate adhesion between silicon particles.

The ultra fine silicon powder is transferred into a clean feed hopper attached to a pellet press machine such as a high quality Courtoy-type rotary indexing die and punch machine. Controlled quantities of the powder are fed into the die by use of an appropriate powder feeder. Since the powder is ultra fine, a special powder feeder may be required. The powder is pressed by the punch with a press force of several tons. No binder or additive is added in the process. The pressed pellet is ejected into a clean collection bin and transferred into a lined shipping container. The pelleting machinery is equipped for automated and controlled operation. In addition, the entire process zone is located inside a controlled enclosure to maintain process and environment quality. The process facility also provides controlled ingress and filtered egress for environmental safety.

Since no binder or additive is utilized in converting the ultra fine silicon powder to pressed pellet form, only nominal pellet strength, satisfactory for the purpose of compaction and transfer to secondary operations, is necessary. Some surface dusting and occasional breakage of pellets still provides an acceptable yield of the high-value end product, the dry, high purity silicon pellets.

DETAILED DESCRIPTION OF THE PREFERRED EMBODIMENT

The invention is susceptible of many embodiments. In a preferred embodiment, a ultra fine silicon powder of median particle size 13 micrometers, bulk density 0.56 g/cc (grams per cubic centimeter) and tap density 0.68 g/cc, is converted into pellets of size 14 mm (millimeter) diameter×10 mm height and pellet weight of 2.3±0.05 g. The pelleting is done on a clean Courtoy R 53 rotary multi-station pellet press with compression force capacity of up to 14 tons.

The actual pellet size is not critical, and uniformity in size is not critical. But preferably, a precise quantity by weight of the silicon powder is fed into the die as a unit charge, and progressively compressed by a matching punch to the required force to achieve the pre-calculated dimension that represents the desired final pellet density based on the weight of the unit charge of powder fed into the die. Alternatively, the process may be operated on the basis of compressing a unit charge sized as a pre-calculated volume of powder, and/or compacting the unit charge to a pre-calculated final pressure or volume, whether by calculation or trial and testing to achieve the desired result.

To produce silicon pellets having the mechanical integrity to withstand packaging, handling, storage and further processing, the silicon powder must be exposed to an effective pressure to insure that there is adequate adhesion between the silicon power particles. By compressing the powder, the silicon atoms of different particles are in sufficiently close proximity to permit bonding or attraction between the atoms and as a result, the particles. The compression packs the particles closer together, eliminating voids and holding the particles, and the atoms of which they are comprised, in close proximity. While this packing need not be the highly ordered packing of crystalline silicon, higher degrees of order and of bonding produce more mechanically stable and purer pellets. According to one embodiment a force of about approximately 10,000 N (1.12 US Tons) was used. Those skilled in the art will readily appreciate that the forces in excess of 10 KN would likewise produce pellets of sufficient structural integrity, as would weaker forces so long as the particles are compacted sufficiently to adhere without additives.

According to one embodiment of the present invention dry silicon powder is used. The presence of moisture might result in clumping, or impurities that might have a deleterious effect on the purity of the final product, the integrity of the pellet, or the operation of the die. Those skilled in the art would, however, readily appreciate that the use of wet silicon powder would be within the scope of the invention.

The compressed pellets are ejected from the machine through the take-off system. The pellets provide a loose bulk material form of silicon for melting for high purity silicon requirements. The powder-to-pellet conversion is accomplished dry, with no added ingredient in the process. This is required to maintain the purity of the silicon for subsequent use.

The term "pellet" is herein inclusive of any form factor and descriptive term that implies a compacted small volume of the raw material, the pellets produced in quantity in the nature of a loose granular bulk material that facilitates easy handling methods and ready conformance to container shapes.

The invention is further extended by the utilization of the pelletized dry silicon in the making of high purity silicon ingots. The suitability of the high-purity dry-compacted pellets for melting into high purity silicon ingots is effectively demonstrated by the preferred embodiment method of containing the pellets in a fused quartz crucible, baking in vacuum at 1350° C., and then melting in an inductively heated graphite susceptor system as is well known in the art. The melt is taken up to 1600° C., and then cooled. The resulting ingot is very bright and shiny, with no inclusions in it. There may be a trace of residual oxide material as slag on top center of the melted ingot. Dry silicon pellets, pressed from silicon powder, were first melted to form an ingot of high purity silicon on Jan. 28, 2002.

The basic steps of a preferred method for making high purity silicon pellets is as follows: providing a source of high purity silicon powder, feeding the powder into a blender, operating the blender to remove agglomerates, discharging the powder into a hopper, feeding a controlled amount by weight or volume of the powder into a die, dry compacting the powder with pressure, exclusive of any additives or wetting agents, and then discharging the dry pellet from the die. The machinery may be configured to operate multiple lines of multiple dies, to meet high volume requirements.

The further steps of making high purity silicon ingots from the dry silicon pellets is conventional except for the use of the dry silicon pellets and the resulting purity of the ingots: containing a suitable number of the silicon pellets in a fused quartz crucible, baking the crucible with pellets in vacuum at about 1350 degrees C., melting the pellets at up to about 1600 degrees C. in an inductively or resistively heated graphite susceptor system, and cooling the melt so as to produce an ingot.

Other and various embodiments will be evident to those skilled in the art, from the specification, abstract, figures and claims that follow.

We claim:

1. A silicon pellet for making silicon ingots, consisting of a dry compacted volume of silicon powder, said powder being free of intentional additives and binders said silicon powder having a median particle size within a range of about 10 to 100 micrometers and a range of particle size of not greater than about 1000 micrometers.

2. The silicon pellet for making silicon ingots according to claim 1, said silicon powder having a median particle size of about approximately 13 micrometers and a range of particle size of not greater than about 1000 micrometers.

3. The silicon pellet for making silicon ingots according to claim 1, said silicon powder having a bulk density within a range of about 0.60 g/cc to about 0.75 g/cc and preferably about 0.68 g/cc.

4. The silicon pellet for making silicon ingots according to claim 1, said silicon powder having a bulk density of about approximately 0.68 g/cc.

5. The silicon pellet for making silicon ingots according to claim 1, said pellet having a density of about 50–75% of the theoretical density of elemental silicon, and having a weight within a range of about 1.0 gram to about 3.0 grams.

6. The silicon pellet for making silicon ingots according to claim 1, said pellets having a weight of about approximately 2.3 grams.

7. The silicon pellet for making silicon ingots according to claim 1, said pellet having a diameter in the range of 10 mm to 20 mm, and a height in the range of 5 mm to 15 mm.

8. The silicon pellet for making silicon ingots according to claim 1, said pellet having a diameter of about approximately 14 mm, and a height of about approximately 10 mm.

9. The silicon pellet for making silicon ingots according to claim 1, wherein said powder comprises substantially pure silicon particles.

10. The silicon pellet for making silicon ingots according to claim 9, wherein said powder is compacted with a force sufficient to cause adhesion between said particles.

11. The silicon pellet for making silicon ingots according to claim 9, wherein said powder is compacted with a force of greater than or equal to about approximately 10,000 newtons.

12. A silicon pellet for making silicon ingots, comprising a dry compacted volume of silicon powder compacted by a force greater than or equal to about approximately 10,000 newtons, said powder being free of intentional additives and binders, said pellet having a density of about approximately 50–75% of the theoretical density of elemental silicon, and having a weight of about approximately 2.3 grams, said pellet having a diameter of about approximately 14 mm, and a height of about approximately 10 mm.

13. A method for making a silicon pellet comprising the steps:
Providing an agglomerate, additive and binder free source of high purity silicon powder having a median particle size within a range of about 10 to 100 micrometers and a range of particle size of not greater than about 1000 micrometers,
feeding a controlled amount of said powder from said source into a pellet die,
dry compacting with pressure said controlled amount of said powder in said die thereby forming a dry pellet of high purity silicon, and
discharging said pellet from said die.

14. The method for making a silicon pellet according to claim 13, said dry compacting being done at about ambient temperature.

15. The method for making a silicon pellet according to claim 13, said powder being free of intentional additives and binders.

16. The method for making a silicon pellet according to claim 13, said controlled amount being a measured weight of said powder.

17. The method for making a silicon pellet according to claim 16, said dry compacting comprising progressively compressing said measured weight of said powder to a dimension calculated to achieve a desired final density.

18. The method for making a silicon pellet according to claim 16, said dry compacting comprising progressively compressing said measured weight of said powder to a pressure calculated to achieve a desired final density.

19. The method for making a silicon pellet according to claim 13, said controlled amount being a measured volume of said powder.

20. The method for making a silicon pellet according to claim 19, said dry compacting comprising progressively compressing said measured volume of said powder to a dimension calculated to achieve a desired final density.

21. The method for making a silicon pellet according to claim 19, said dry compacting comprising progressively compressing said measured volume of said powder to a pressure calculated to achieve a desired final density.

22. The method for making a silicon pellet according to claim 13 wherein said step of dry compressing comprises applying a force to said powder sufficient to cause particles within said powder to adhere to each other.

23. The method for making a silicon pellet according to claim 13 wherein said step of dry compressing comprises applying a force greater than or equal to about approximately 10,000 newtons to said powder.

24. A silicon pellet for the making of silicon ingots produced by a process comprising the steps of:
Providing an agglomerate, additive and binder free source of high purity silicon powder having a median particle size within a range of about 10 to 100 micrometers and a range of particle size of not greater than about 1000 micrometers,
Feeding a controlled amount of said powder from said source into a pellet die,
Dry compacting with pressure said controlled amount of said powder in said die thereby forming a dry pellet of high purity silicon, and
Discharging said pellet from said die.

25. The silicon pellet according to claim 24, said dry compacting being done at about ambient temperature.

26. The silicon pellet according to claim 24, said controlled amount being a measured weight of said powder.

27. The silicon pellet according to claim 26, said dry compacting comprising progressively compressing said measured weight of said powder to a dimension calculated to achieve a desired final density.

28. The silicon pellet according to claim 26, said dry compacting comprising progressively compressing said measured weight of said powder to a pressure calculated to achieve a desired final density.

29. The silicon pellet according to claim 24, said controlled amount being a measured volume of said powder.

30. The silicon pellet according to claim 29, said dry compacting comprising progressively compressing said measured volume of said powder to a dimension calculated to achieve a desired final density.

31. The silicon pellet according to claim 29, said dry compacting comprising progressively compressing said measured volume of said powder to a pressure calculated to achieve a desired final density.

32. The silicon pellet according to claim 24, said wherein said step of dry compacting comprises applying a force to said powder sufficient to cause particles within said powder to adhere to each other.

33. The silicon pellet according to claim 24 wherein said step of dry compaction comprises applying a force of greater than or equal to 10,000 newtons to said powder.

* * * * *